United States Patent
Chang

(10) Patent No.: US 6,611,407 B1
(45) Date of Patent: Aug. 26, 2003

(54) ESD PROTECTION CIRCUIT

(75) Inventor: Tae Sig Chang, Chungcheongbuk-do (KR)

(73) Assignee: Hyundai Electronics Industries Co., Ltd.

( * ) Notice: Subject to any disclaimer, the term of this patent is extended or adjusted under 35 U.S.C. 154(b) by 0 days.

(21) Appl. No.: 09/468,957

(22) Filed: Dec. 22, 1999

(30) Foreign Application Priority Data

Mar. 18, 1999 (KR) .......................................... 1999-9234

(51) Int. Cl.⁷ ................................................ H02H 9/00
(52) U.S. Cl. ...................................................... 361/56
(58) Field of Search ............ 361/56, 111; 257/355–358

(56) References Cited

U.S. PATENT DOCUMENTS

| | | | | |
|---|---|---|---|---|
| 5,301,081 A | * | 4/1994 | Podell et al. .................. 361/56 |
| 5,400,202 A | * | 3/1995 | Metz et al. .................... 361/56 |
| 5,838,146 A | * | 11/1998 | Singer ......................... 323/270 |
| 5,959,488 A | * | 9/1999 | Lin et al. ..................... 327/313 |
| 5,995,354 A | * | 11/1999 | Yu ............................. 361/111 |
| 6,097,235 A | * | 8/2000 | Hsu et al. .................... 327/309 |

* cited by examiner

Primary Examiner—Ronald W. Leja
(74) Attorney, Agent, or Firm—Fleshner & Kim, LLP

(57) ABSTRACT

ESD protection circuit which can minimize fluctuation of a gate voltage with an ESD input voltage, for improving an ESD protection capability, including a first transistor connected to an input pad for discharging an ESD charge, a capacitor and a diode connected to the input pad for applying a gate voltage to a gate of the first transistor to improve a bipolar driving capability of the first transistor, a second transistor for controlling drive of the first transistor when the chip is operative, and a resistor for delaying transmission of an ESD charge to an inner circuit when the ESD charge is received at the input pad.

18 Claims, 2 Drawing Sheets

ESD PROTECTION CIRCUIT

BACKGROUND OF THE INVENTION

1. Field of the Invention

The present invention relates to an ESD (Electro-Static Discharge) protection circuit, and more particularly, to an ESD protection circuit which can improve an ESD protection capability.

2. Background of the Related Art

In general, because static electricity which affects a device reliability is a momentary high voltage that can give an influence to any place around it, a countermeasure against the electro-static discharge is very important. Though there was no problem caused by the static electricity even if no particular countermeasure against the ESD is provided when a large sized device is used, presently the countermeasure against the ESD becomes one of important condition of quality guarantee as causes of product failure are increased due to the size reduction and the increased number of pins according to the trend of packing devices to a high density and providing many pins. As the countermeasure of a semiconductor chip against such a static electricity, a protection circuit is inserted between outer pins which come to contact with the static electricity and an inner circuit, so that the inner circuit can be protected against the high static electricity and be maintained at an appropriate voltage during the static electricity passes through the protection circuit, and particularly, the protection circuit should be designed within a range in which no influence is given to a product performance. Due to this reason, there have been studies on an output terminal protection circuit use of a device having the protection circuit applied thereto is restricted due to output characteristics of the device, rather than on an input terminal protection circuit which can be designed and used without any restriction.

In the meantime, a DRAM, fabricated as CMOS, is involved in decrease of a breakdown voltage of a junction, as a device packing density is increased as the generation progresses, and particularly, the input terminal and the output terminal are susceptible to the static electricity.

There are two kinds of electro-static discharge.

First one is an electro-static discharge occurred when the DRAM, assembled in a form of package, passes through a handler lane for testing before shipment, called a machine mode, which has a low voltage, approx. 250V, but has a small impedance with a relatively great amount of electric charge.

Second one is an electro-static discharge coming from the static electricity induced in a human body when a user's hand is come into contact with the DRAM, called a human body mode, having a high voltage of approx. 2000V with a great impedance.

In order to protect the DRAM from breakage following an inflow of such static electricity, a variety of input protection circuit is provided in the DRAM, that employs a method in which a high voltage pulse, or a high current pulse is not lead into the inner circuit, but lead to wiring with a large amount of metal line, such as ground of power line.

A related art ESD protection circuit will be explained with reference to the attached drawings. FIG. 1 illustrates a circuit showing a related art ESD protection circuit.

Referring to FIG. 1, the related art ESD protection circuit is provided with a transistor 11 connected to an input pad (PAD) 10 for discharging an ESD charge upon reception, a capacitor 12 and a first resistor 13 connected to the input pad 10 for applying a gate voltage to a gate of the transistor 11 when the input pad receives the ESD charge for improving a bipolar driving capability of the transistor 11, and a second resistor 14 for delaying transmission of the ESD charge received at the input pad PAD into the inner circuit. The transistor 11 has a drain connected to the input pad (PAD) and a source connected to a ground terminal Vss. The capacitor 12 and the first resistor 13 are connected in series between the input pad 10 and the ground terminal Vss. A gate of the transistor 11 is connected to a contact 'A' between the capacitor 12 and the first resistor 13.

The operation of the aforementioned related art ESD protection circuit will be explained.

Upon reception of an ESD charge (approx. 200V~3000V) at the input pad 10, a bias is provided to the gate of the transistor 11 through the capacitor 12 connected to the input pad. Then, the bias provided to the gate of the transistor 11 drops a breakdown voltage of the transistor 11, assisting the transistor 11 operative in a bipolar quickly for discharging the ESD charge received at the input pad. In this instance, because much current is discharged through the transistor 11, which lowers a breakdown voltage of the transistor 11, if a gate voltage in the transistor 11 is high over 2V, a current should be discharged through the first resistor 13, to maintain the gate voltage within 0.7~2V. If the voltage to the gate of the transistor 11 is over 2V, the transistor 11 is not operative normally, causing an effective ESD charge discharge impossible.

However, the related art ESD protection circuit has the following problems.

Because the gate voltage fluctuates with the ESD voltage provided to the capacitor and the resistor connected in series between the input pad and the ground terminal, it is difficult to optimize (0.7~2V) a capacitance and a resistance provided to the gate of the transistor, so that the ESD protection circuit is operative well in different modes, such as HBM (Human Body Mode), MM (Machine Mode), and CDM (Charged Device Mode).

SUMMARY OF THE INVENTION

Accordingly, the present invention is directed to an ESD protection circuit that substantially obviates one or more of the problems due to limitations and disadvantages of the related art.

An object of the present invention is to provide an ESD protection circuit which can minimize fluctuation of a gate voltage with an ESD input voltage, for improving an ESD protection capability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the ESD protection circuit includes a first transistor connected to an input pad for discharging an ESD charge, a capacitor and a diode connected to the input pad for applying a gate voltage to a gate of the first transistor to improve a bipolar driving capability of the first transistor, a second transistor for controlling drive of the first transistor when the chip is operative, and a resistor for delaying transmission of an ESD charge to an inner circuit when the ESD charge is received at the input pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
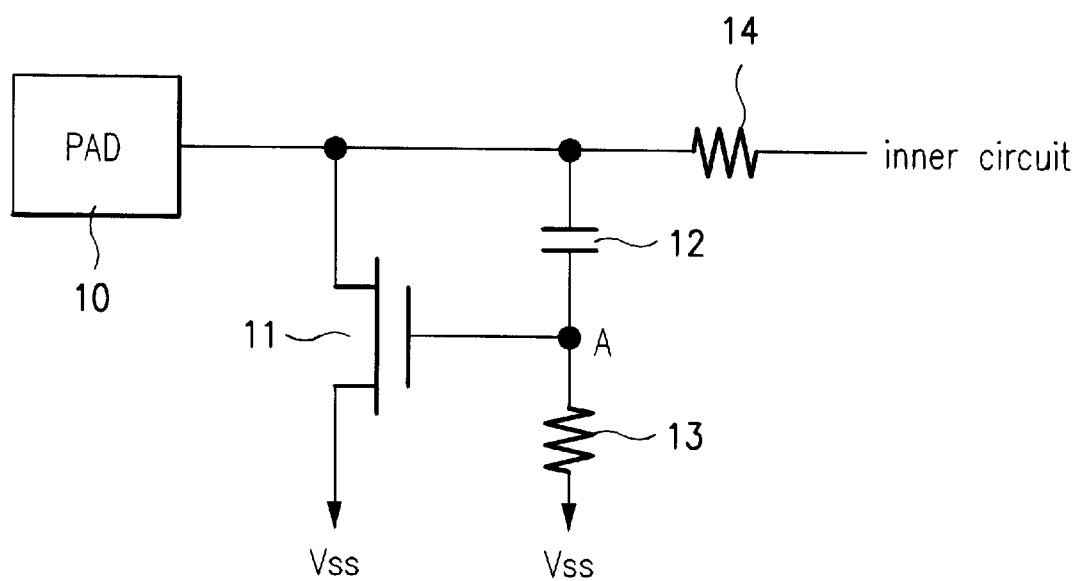
FIG. 1 illustrates a circuit showing a related art ESD protection circuit.
Figure 2:
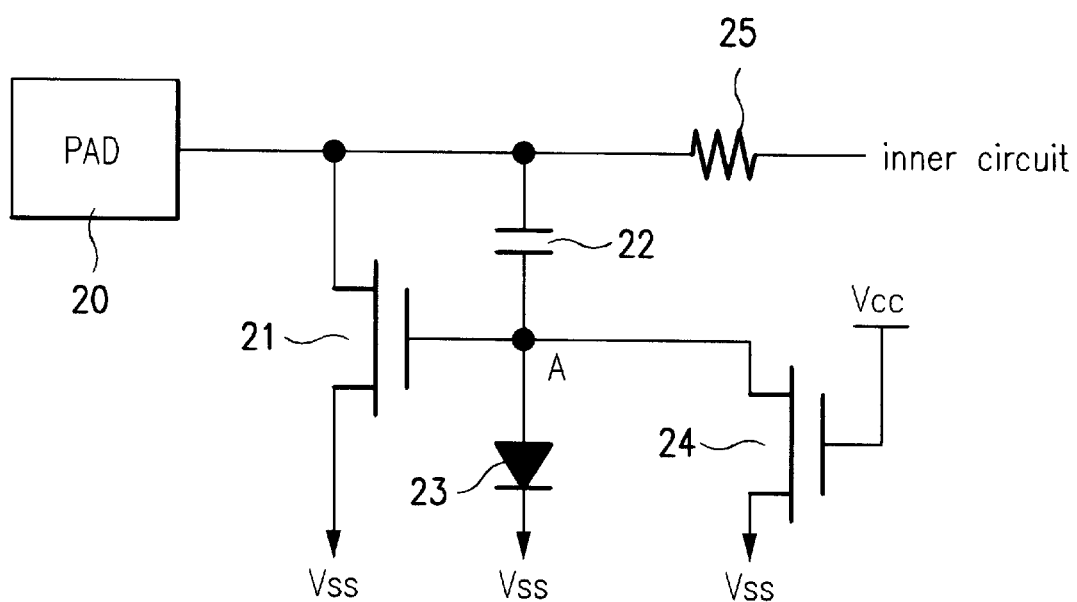
FIG. 2 illustrates a circuit showing an ESD protection circuit in accordance with a preferred embodiment of the present invention; and, FIG. 3 illustrates a section showing a structure of an ESD protection circuit of the present invention.

Reference will now be made in detail to the preferred embodiments of the present invention, examples of which are illustrated in the accompanying drawings. FIG. 2 illustrates a circuit showing an ESD protection circuit in accordance with a preferred embodiment of the present invention.

Referring to FIG. 2, the ESD protection circuit in accordance with a preferred embodiment of the present invention includes a first transistor 21 connected to an input pad (PAD) 20 for discharging an ESD charge, a capacitor 22 and a diode 23 connected to the input pad for applying a gate voltage to a gate of the first transistor 21 to improve a bipolar driving capability of the first transistor 21, a second transistor 24 for controlling drive of the first transistor 21 when the chip is operative, and a resistor 25 for delaying transmission of an ESD charge to an inner circuit when the ESD charge is applied to the input pad. The first transistor 21 has a drain connected to the input pad and a source connected to the ground terminal Vss. The capacitor 22 and the diode 23 are connected in series between the input pad 20 and the ground terminal Vss, and the gate of the first transistor 21 is connected to a contact 'A' of the capacitor 22 and the diode 23. The diode 23 has an anode connected to the capacitor 22 and a cathode connected to the ground terminal Vss. The second transistor 24 has a drain connected to the contact 'A' of the capacitor 22 and the diode 23, a source connected to a ground terminal Vss, and a gate connected to power source Vcc. The capacitor 22 is an overlap capacitor between the drain and the gate of the first transistor 21.

The operation of the aforementioned ESD protection circuit in accordance with a preferred embodiment of the present invention will be explained.

Upon reception of an ESD charge at the input pad (PAD), a bias is provided to the gate of the first transistor 21 through the capacitor 22. Then, the bias provided to the gate of the first transistor 21 causes to drop a breakdown voltage of the first transistor 21, so that the first transistor 21 is operative in bipolar, quickly. In this instance, if the gate voltage of the first transistor 21 rises over 0.7V, the diode 23 is turned on, preventing the gate voltage of the first transistor to rise over 0.7V. And, upon application of power to the power source terminal Vcc during the chip is in operation, the second transistor 24 is turned on, always holding the gate voltage of the first transistor 21 to '0', thereby preventing the first transistor 21 come into operation in a regular operation condition.

Figure 3:
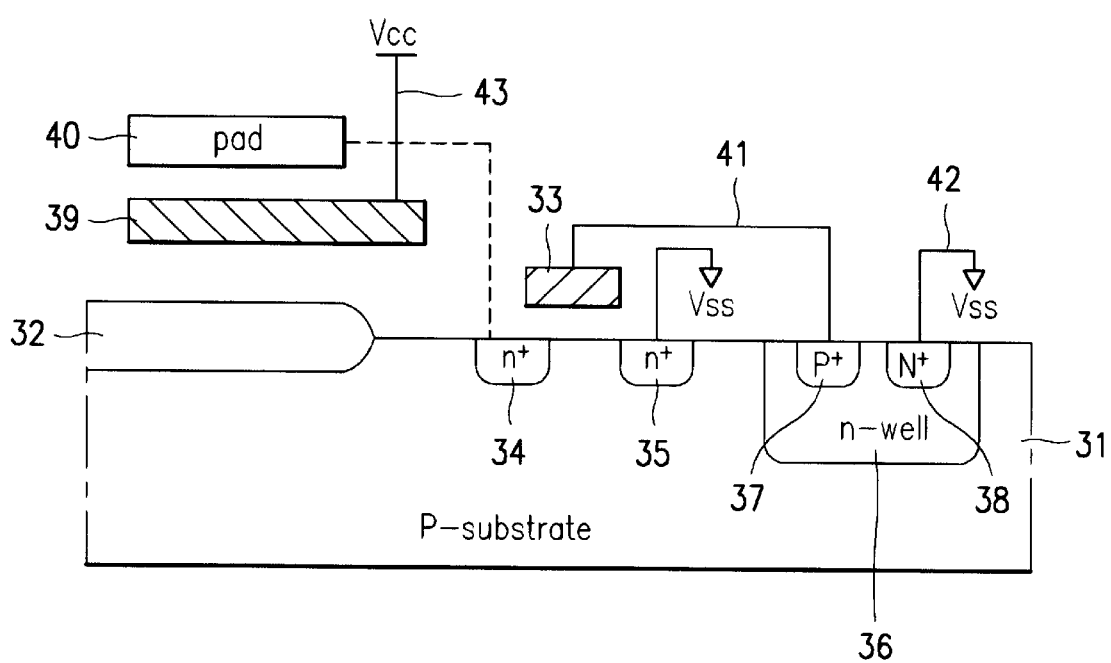

FIG. 3 illustrates a section showing a structure of an ESD protection circuit of the present invention.

Referring to FIG. 3, the ESD protection circuit of the present invention includes a device isolation film 32 formed on a region of a P type semiconductor substrate 31, and a first gate 33 on a region of the semiconductor substrate 31 having no device isolation film 32 formed thereon with a gate insulating film (not shown) inbetween. There are a drain region 34 formed in a surface of the semiconductor substrate 31 on one side of the first gate 33 to overlap with the first gate 33 and a source region 35 formed in a surface of the semiconductor substrate 31 on the other side of the first gate 33. There are an n-well region 36 formed in a region of the semiconductor substrate 31, a P type impurity region 37 and an N type impurity region 38 spaced from each other in surfaces of the semiconductor substrate 31 having the n-well region 36 formed therein, and a second gate 39 over the device isolation film 32. And, there are an input pad 40 connected to the drain region 34, a wiring line 41 connecting drain regions (not shown) of the first gate 33 and the second gate 39 and the P type impurity region 37, a ground line (Vss) 42 connecting the N type impurity region 38 and the source region 35, and a power source line 43 connected to the second gate 39. The first gate 33, the second gate 39, the input pad 40, and each of the lines are insulated by insulating films (not shown). The first gate 33 and the drain region 34 overlapped with the first gate 33 form a capacitor.

Because the transistor which discharges an ESD charge is controlled by a capacitor and a diode, allowing that a gate voltage can be held at a voltage of 0.5~0.7V, a threshold voltage of the diode, regardless of a frequency and a voltage of waveforms applied to the input pad, the ESD protection circuit of the present invention can optimize the operation of the ESD protection circuit.

It will be apparent to those skilled in the art that various modifications and variations can be made in the ESD protection circuit of the present invention without departing from the spirit or scope of the invention. Thus, it is intended that the present invention cover the modifications and variations of this invention provided they come within the scope of the appended claims and their equivalents.

What is claimed is:

1. An ESD (Electro-Static Discharge) protection circuit comprising:
    a first transistor connected to an input pad for discharging an ESD charge;
    a capacitor and a diode connected to the input pad for applying a gate voltage to a gate of the first transistor to improve a bipolar driving capability of the first transistor;
    a second transistor for controlling a drive of the first transistor when a chip is operative, the second transistor having a drain connected to a contact of the capacitor and the diode, a source connected to a ground terminal, and a gate connected to a power source; and
    a resistor for delaying transmission of the ESD charge to an inner circuit when the ESD charge is received at the input pad.

2. An ESD protection circuit as claimed in claim 1, wherein the first transistor has a drain connected to the input pad and a source connected to the ground terminal.

3. An ESD protection circuit as claimed in claim 1, wherein the capacitor and the diode are connected in series between the input pad and the ground terminal.

4. An ESD protection circuit as claimed in claim 1, wherein the gate of the first transistor is connected to a contact of the capacitor and the diode.

5. An ESD protection circuit as claimed in claim 1, wherein the diode has an anode connected to the capacitor and a cathode connected to the ground terminal.

6. An ESD protection circuit as claimed in claim 1, wherein the capacitor is an overlap capacitor between a drain and the gate of the first transistor.

7. The ESD protection circuit of claim 1, wherein the second transistor continuously controls the drive of the first transistor when the chip is operative by being connected to the power source.

8. The ESD protection circuit of claim 1, wherein the second transistor continuously controls the drive of the first transistor when the power source is energized.

9. A circuit, comprising:
   a capacitor coupled to a pad;
   a diode coupled between the capacitor and a first reference voltage;
   a first transistor coupled between the pad and a contact point between the capacitor and the diode; and
   a second transistor coupled to the contact point and having a control electrode directly connected to a second reference voltage greater than the first reference voltage.

10. The circuit of claim 9, wherein the second transistor drives the first transistor when operative.

11. The circuit of claim 9, wherein the first transistor has a control electrode coupled to a second electrode of the second transistor.

12. The circuit of claim 9, wherein the first transistor has a second electrode coupled to the pad, a control electrode coupled to the second transistor and a first electrode coupled to the first reference voltage.

13. The circuit of claim 12, wherein the control electrode of the first transistor is coupled to a second electrode of the second transistor.

14. The circuit of claim 9, wherein the second transistor has a second electrode coupled to the first transistor and a first electrode coupled to the first reference voltage.

15. The circuit of claim 9, wherein the second transistor continuously drives the first transistor when the second reference voltage is energized.

16. The circuit of claim 9, wherein:
   the first transistor has a second electrode coupled to the pad, a control electrode coupled to the contact point and the second transistor, and a first electrode coupled to the first reference voltage;
   the capacitor is coupled to the control electrode of the first transistor and the diode;
   the diode is coupled to the control electrode of the first transistor and the capacitor; and
   the second transistor has a second electrode coupled to the control electrode of the first transistor and a first electrode coupled to the first reference voltage.

17. The circuit of claim 9, further comprising a resistor coupled between the pad and an inner circuit.

18. The circuit of claim 9, wherein the second transistor continuously controls a drive of a first transistor when the circuit is operative by being connected to the second reference voltage.

* * * * *